United States Patent
Kapoor et al.

(10) Patent No.: US 9,379,214 B2
(45) Date of Patent: Jun. 28, 2016

(54) REDUCED VARIATION MOSFET USING A DRAIN-EXTENSION-LAST PROCESS

(71) Applicant: Semi Solutions LLC, Los Gatos, CA (US)

(72) Inventors: Ashok K. Kapoor, Palo Alto, CA (US); Robert J. Strain, San Jose, CA (US)

(73) Assignee: Semi Solutions LLC, Los Gatos, CA (US)

( * ) Notice: Subject to any disclaimer, the term of this patent is extended or adjusted under 35 U.S.C. 154(b) by 0 days.

(21) Appl. No.: 14/616,964

(22) Filed: Feb. 9, 2015

(65) Prior Publication Data

US 2015/0236117 A1    Aug. 20, 2015

Related U.S. Application Data

(60) Provisional application No. 61/940,026, filed on Feb. 14, 2014.

(51) Int. Cl.
| | |
|---|---|
| *H01L 29/00* | (2006.01) |
| *H01L 29/66* | (2006.01) |
| *H01L 29/78* | (2006.01) |
| *H01L 21/8238* | (2006.01) |
| *H01L 29/165* | (2006.01) |

(52) U.S. Cl.
CPC .... *H01L 29/6659* (2013.01); *H01L 21/823814* (2013.01); *H01L 29/6653* (2013.01); *H01L 29/6656* (2013.01); *H01L 29/66492* (2013.01); *H01L 29/66575* (2013.01); *H01L 29/66636* (2013.01); *H01L 29/7834* (2013.01); *H01L 29/165* (2013.01); *H01L 29/665* (2013.01)

(58) Field of Classification Search
CPC ................. H01L 29/6656; H01L 29/66492; H01L 29/66575
See application file for complete search history.

(56) References Cited

U.S. PATENT DOCUMENTS

| | | | | |
|---|---|---|---|---|
| 6,329,258 B1 * | 12/2001 | Inaba | ................ | H01L 21/28123 257/E21.206 |
| 6,358,800 B1 * | 3/2002 | Tseng | ................ | H01L 21/3086 257/E21.235 |
| 6,727,558 B1 * | 4/2004 | Duane | ............ | H01L 21/823412 257/374 |
| 6,806,537 B2 * | 10/2004 | Matsumoto | ....... | H01L 29/66636 257/347 |
| 6,881,635 B1 * | 4/2005 | Chidambarrao | ........ | C30B 25/18 257/E21.131 |
| 8,012,820 B2 | 9/2011 | Majumdar et al. | | |
| 8,273,617 B2 | 9/2012 | Thompson et al. | | |

(Continued)

OTHER PUBLICATIONS

Aoki, M., et al., "0.1 μm CMOS Devices Using Low-Impurity-Channel Transistors (LICT)", *International Electron Devices Meeting, 1990. IEDM '90 Technical Digest*, (Dec. 9-12, 1990), pp. 9.8.1 to 9.8.3.

(Continued)

*Primary Examiner* — Ngan Ngo
(74) *Attorney, Agent, or Firm* — Blakely Sokoloff Taylor & Zafman LLP

(57) ABSTRACT

A MOSFET structure and method of manufacture that minimize threshold variations associated with statistical uncertainties of implanted source and drain extensions. The source and drain extensions are fabricated very late in the process using a material added to etched recesses immediately adjacent to the transistor's channel. In various embodiments, the added material may be germanium grown by selective epitaxy, doped silicon grown by selective epitaxy, or metallic materials created by deposition or by deposition and reaction.

19 Claims, 11 Drawing Sheets

(56) References Cited

U.S. PATENT DOCUMENTS

| | | | | |
|---|---|---|---|---|
| 8,546,203 B1* | 10/2013 | Cheng | | H01L 21/84 257/347 |
| 8,614,486 B2 | 12/2013 | Haran et al. | | |
| 2002/0190284 A1* | 12/2002 | Murthy | | H01L 21/28052 257/286 |
| 2006/0138398 A1* | 6/2006 | Shimamune | | H01L 21/02381 257/19 |
| 2008/0128748 A1* | 6/2008 | Iinuma | | H01L 21/76232 257/190 |
| 2009/0039426 A1* | 2/2009 | Cartier | | H01L 21/28079 257/344 |
| 2009/0101942 A1* | 4/2009 | Dyer | | H01L 21/30608 257/288 |
| 2009/0108352 A1* | 4/2009 | Majumdar | | H01L 29/4908 257/347 |
| 2009/0124056 A1* | 5/2009 | Chen | | H01L 21/26513 438/278 |
| 2009/0170268 A1* | 7/2009 | Teo | | H01L 21/26586 438/285 |
| 2010/0320547 A1* | 12/2010 | Ando | | H01L 21/28088 257/411 |
| 2011/0074498 A1 | 3/2011 | Thompson et al. | | |
| 2011/0121398 A1* | 5/2011 | Hoentschel | | H01L 21/26513 257/369 |
| 2011/0147828 A1* | 6/2011 | Murthy | | H01L 21/02057 257/327 |
| 2011/0165739 A1 | 7/2011 | Majumdar et al. | | |
| 2011/0171792 A1* | 7/2011 | Chang | | G03F 9/7084 438/157 |
| 2011/0230017 A1* | 9/2011 | Khater | | H01L 29/78654 438/151 |
| 2012/0001254 A1* | 1/2012 | Kronholz | | H01L 21/823807 257/327 |
| 2012/0043614 A1* | 2/2012 | Choi | | H01L 28/20 257/369 |
| 2012/0058610 A1* | 3/2012 | Ookoshi | | H01L 21/823807 438/230 |
| 2012/0161238 A1* | 6/2012 | Scheiper | | H01L 21/823412 257/368 |
| 2013/0015512 A1 | 1/2013 | Haran et al. | | |
| 2013/0020658 A1* | 1/2013 | Guo | | H01L 29/4958 257/412 |
| 2013/0032859 A1* | 2/2013 | Pei | | H01L 29/6656 257/192 |
| 2013/0099281 A1* | 4/2013 | Yu | | H01L 29/6659 257/190 |
| 2013/0264639 A1* | 10/2013 | Glass | | H01L 21/28512 257/335 |
| 2013/0313655 A1* | 11/2013 | Wang | | H01L 29/7846 257/402 |
| 2014/0054710 A1* | 2/2014 | Choi | | H01L 29/665 257/368 |
| 2014/0231923 A1* | 8/2014 | Yin | | H01L 29/66545 257/369 |
| 2015/0011056 A1* | 1/2015 | Kapoor | | H01L 29/66537 438/163 |
| 2015/0132914 A1* | 5/2015 | Wasyluk | | H01L 29/6656 438/287 |

OTHER PUBLICATIONS

Asenov, Asen, et al., "Suppression of Random Dopant-Induced Threshold Voltage Fluctuations in Sub-0.1-μm MOSFET's with Epitaxial and δ-Doped Channels", *IEEE Transactions on Electron Devices*, vol. 46, No. 8, (Aug. 1999), pp. 1718-1724.

Clark, L. T., et al., "A Highly Integrated 65-nm SoC Process with Enhanced Power/Performance of Digital and Analog Circuits", *International Electron Devices Meeting, IEDM 2012*, (Dec. 10-13, 2012), pp. 14.4.1 to 14.4.4.

Fujita, K., et al., "Advanced Channel Engineering Achieving Aggressive Reduction of $V_T$ Variation for Ultra-Low Power Applications", *Electron Devices Meeting (IEDM), 2011 IEEE International*, (Dec. 2011), pp. 32.3.1-32.3.4.

\* cited by examiner

REDUCED VARIATION MOSFET USING A DRAIN-EXTENSION-LAST PROCESS

CROSS-REFERENCE TO RELATED APPLICATIONS

This application claims the benefit of U.S. Provisional Patent Application No. 61/940,026 filed Feb. 14, 2014, the content of which is included by reference in its entirety.

BACKGROUND OF THE INVENTION

1. Field of the Invention

The present invention generally relates to the structure and manufacturing of metal-oxide semiconductor field effect transistors (MOSFETs), and more particularly to MOSFETs manufactured for reproducibility of threshold voltages among otherwise identical transistors.

2. Prior Art

As dimensions of metal-oxide semiconductor (MOS) field effect transistors (FETs) become smaller, they are more and more subject to variations in their properties arising from the randomness of the exact positions of dopants in and near the channel. Such variations, particularly random variations in threshold voltage ($\sigma VT$), are devastating in circuits like low-power static random access memories. Random variations in threshold voltage increase both the minimum voltage required for reliable operation and the leakage current. Both effects have an adverse effect on the power consumption at a given level of performance.

Random threshold variations $\sigma VT$ are caused by some dominant factors: (i) random dopant fluctuations (RDF) in the well and in the pocket implant regions underneath the gate, which, among other things, cause variations in depletion layer thickness; (ii) line edge roughness (LER) which causes random variation in the length of the gate electrode resulting from random variations in profile of the etched gate; and, (iii) metal gate granularity (MGG) which causes random variations in the local work function due to the grain structure of the gate material. A fourth source of variation is randomness in the effective channel length, arising from statistical variations in the position of the junction that separates the channel from either the source or the drain extensions. This effect, which will be addressed below, has two principal sources: a) variations in the final position of implanted ions due to scattering; and, b) variations in the activation and positions of the source/drain extension ions as influenced by the activation and subsequent heat treatments. Randomness in channel length affects all transistors, but some of the strategies used to mitigate random channel doping fluctuations RDF actually exacerbate the randomness of the channel length.

Drain extensions in modern transistors are required because the very heavily doped sources and drains, if they were located immediately adjacent to the channel region, would out-diffuse into the channel and cause short circuits at the worst or very high leakage at the least. The drain extensions, even though fairly heavily doped for conductivity, allow the heaviest implants to be positioned some distance from the channel.

FIGS. 1A through 1D show a typical approach to creating drain and source extensions. FIG. 1A shows a cross-section of a substrate with well implants 110, and that has a gate oxide 120 grown on it. Over the gate oxide there is a silicon gate 130, either polycrystalline or amorphous, and that gate has been oxidized to form an oxidation layer 140 subsequent to patterning. At this stage, FIG. 1B, an ion implantation or a sequence of implantations 151 are used to create source and drain extensions 150.

FIG. 1C shows a spacer 160 that has been formed by chemical vapor deposition (CVD), with or without plasma assistance, of silicon nitride typically. Through the use of anisotropic plasma etching, the deposited material, e. g., nitride, is removed from all surfaces parallel to the silicon wafer surface, but the spacer 160 remains on the sidewall. The spacer protects the source and drain extensions 150 during the ion implantation 171 that creates the very heavily doped source and drain regions 170. The ion implantation steps 151 and 171 must be followed by an annealing step to repair crystal damage and to activate the dopants. While at least one annealing step is required, some process flows anneal multiple times. In a complementary metal oxide semiconductor (CMOS) process, the implant steps 151 and 171 must be done for both n-channel metal oxide semiconductor (NMOS) and p-channel metal oxide semiconductor (PMOS) devices. Rapid thermal annealing is the norm for implants 351 and 371, but peak temperatures can exceed 1000° C. As suggested by FIG. 1D, the sheet resistance of the source and drain regions 170 is further reduced by reaction with metallic Ti, Co or Ni to form a highly conductive layer of metal silicide 180. These steps are followed by the formation of interlayer dielectrics (ILD), contacts, and multiple layers of interconnect.

Even though the gate 130 and its oxide 140 act as a hard mask, the final locations of the channel defining edges of the source and drain extensions 150 are subject to localized, random variations. Some of these variations are associated with scattering of the implanted ions as they come to rest in the silicon, and some of the variations are associated with local diffusion of both the doping ions and crystalline defects during the annealing processes. The overall effect of these uncertainties is to impose a random variation on the length of the channel. For transistors having channel lengths of less than 65 nm, the channel length affects both the threshold voltage and the current carrying capability of the transistors. Some of these effects are mitigated by adding pocket implants to the drain extension sequence 151, but the pocket implants are also subject to random variations.

Certain approaches to reducing the effect of random doping density variations involve the use of a very lightly doped epitaxial layer beneath the gate. This class of transistor, which will be referred to herein as an epitaxial transistor, has been described variously in past publications including M. Aoki, et al., "0.1 mu m CMOS devices using low-impurity-channel transistors (LICT)," *Electron Devices Meeting, 1990. IEDM '90. Technical Digest., International*, pp. 939, 941, 9-12 Dec. 1990. More recent publications include Asenov et al. in the paper "Suppression of Random Dopant-Induced Threshold Voltage Fluctuations in Sub-0.1-μm MOSFETs with Epi-taxial and δ-Doped Channels," *IEEE Transactions on Electron Devices*, Vol. 46, No. 8, August 1999, Pages 1718-1724, Fujita et al. in their paper "Advanced Channel Engineering Achieving Aggressive Reduction of $V_T$ Variation for Ultra-Low-Power Applications", *Electron Devices Meeting (IEDM)*, 2011 IEEE International, pp. 32.3.1-32.3.4, 5-7 Dec. 2011, Clark, et al., "A Highly Integrated 65-nm SoC Process with Enhanced Power/Performance of Digital and Analog Circuits,", *Electron Devices Meeting (IEDM)*, 2012 IEEE International, pp. 14.4.1-14.4.4, 10-13 Dec. 2011, and U.S. Pat. No. 8,273,617 B2, "Electronic devices and systems,) and methods for making and using the same," by Thompson and Thummalapally (Sep. 25, 2012). The very lightly doped channel regions are more subject to threshold perturbations by the tails of source/drain extension implants.

In view of the deficiencies of the prior art it would be advantageous to provide a transistor structure and/or a manufacturing process that reduces variations between otherwise identical transistors of an integrated circuit.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE PREFERRED EMBODIMENTS

Figure 1A:
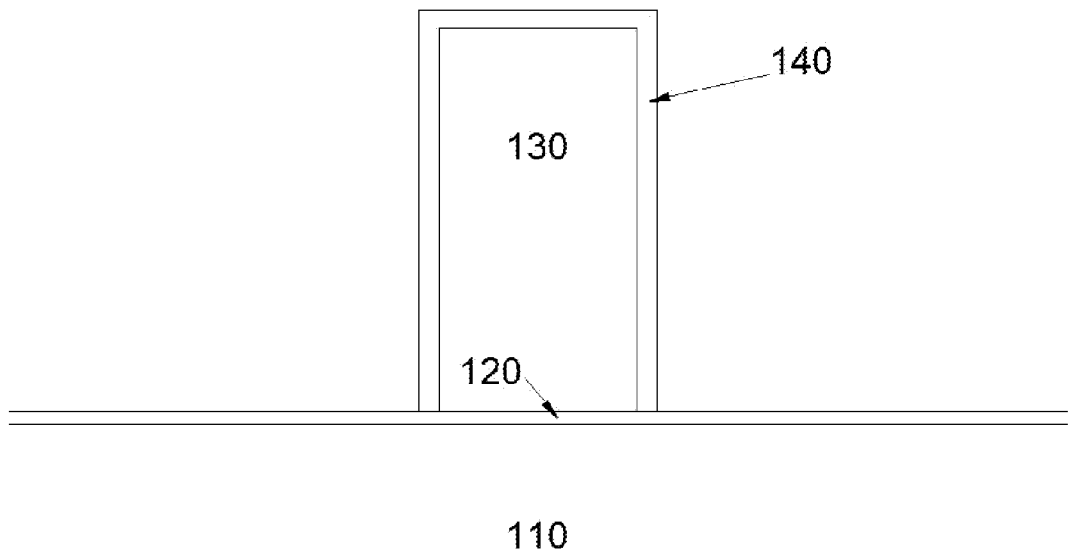
FIG. 1A is a schematic cross-section of a MOSFET gate on gate oxide and substrate (prior art).
Figure 1B:
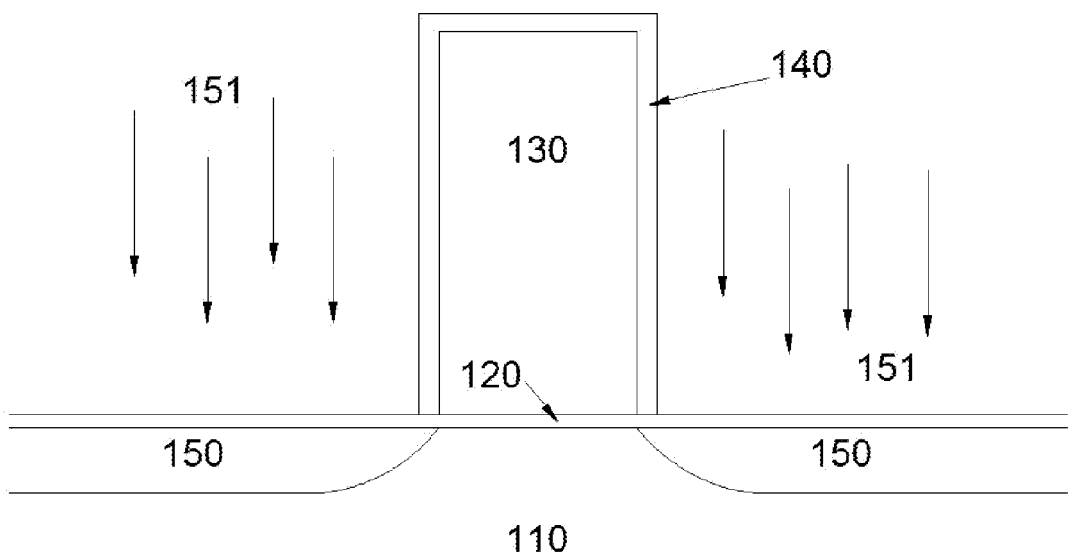
FIG. 1B is a schematic cross-section of a MOSFET gate with the source/drain extension implant (prior art).
Figure 1C:
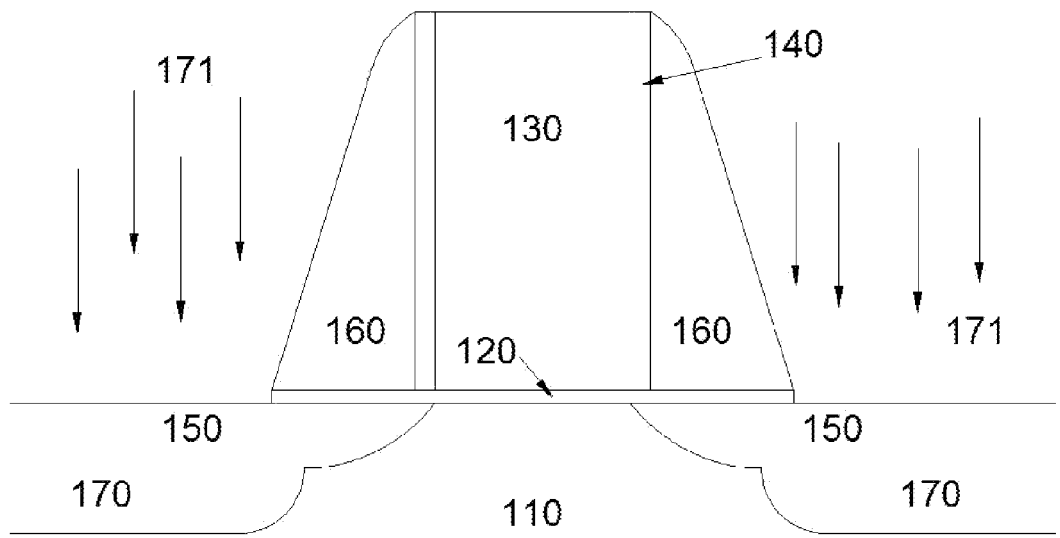
FIG. 1C is a schematic cross-section of a MOSFET gate with a spacer in place and the heavy source/drain (N+ or P+) implant (prior art).
Figure 1D:
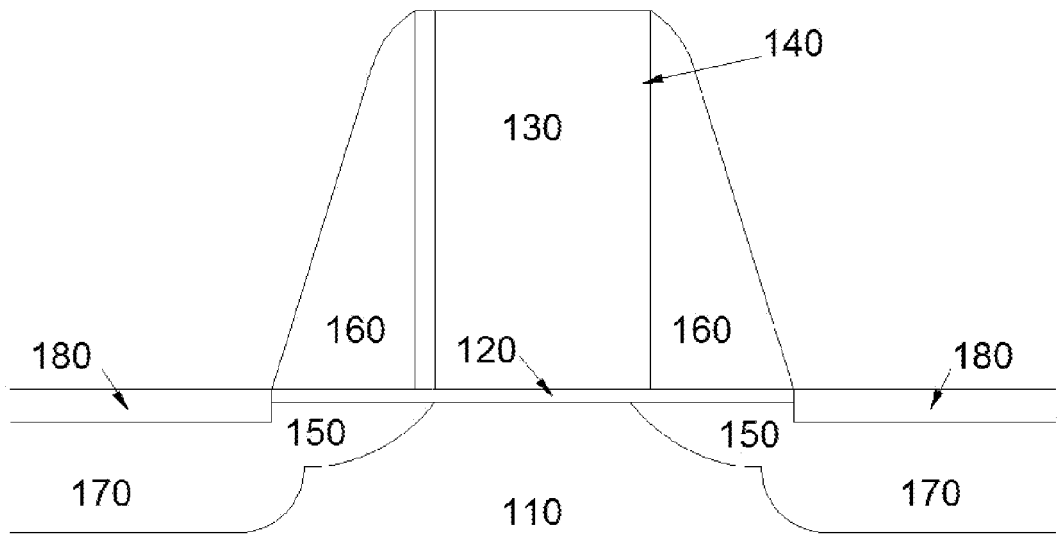
FIG. 1D is a schematic cross-section of a MOSFET gate with the source and drain finished with a metallic silicide layer to reduce source/drain parasitic resistance (prior art).

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

In order to minimize the impact of out-diffusion from the source and drain extensions, embodiments move their formation to a very late position in the transistors' fabrication, and these extensions are defined in a manner that exposes them for the least reasonable time at high temperatures. The drain and source extensions are referred to collectively because the embodiments describe a symmetrical structure in which the drain and source are not distinguished from one another. In an embodiment, the source and drain extensions are fabricated just prior to source and drain silicidation, and they are fabricated from a highly conductive material that is added to the underlying substrate. Contact to the active channel is assured by forming the highly conductive material in a slight recess adjacent to the active channel. One method of realizing this structure is by using a first spacer to define the position of the heavy source and drain implants, and then later sacrificing that spacer. An exemplary process sequence will be described later.

Figure 2:
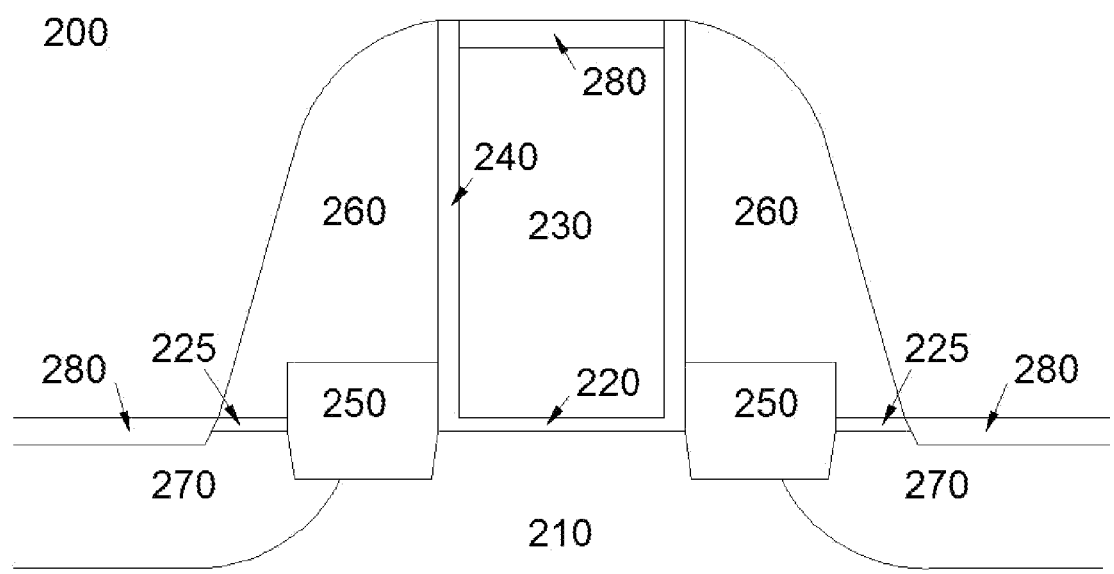
FIG. 2 is a schematic cross-section of a transistor realized in accordance with an embodiment.

FIG. 2 shows an exemplary and non-limiting completed transistor structure 200 according to an embodiment. Region 210 is that portion of a transistor well in the immediate vicinity of the transistor's active channel. This well may be formed by any of a number of process sequences. A conventional sequence of implants, phosphorus and/or arsenic for PMOS (p-channel, metal oxide semiconductor) transistors or boron, $BF_2^+$ and/or indium for NMOS (n-channel, metal oxide semiconductor) transistors will realize a standard well with threshold setting implants. A somewhat different sequence of implants would realize a retrograde doping profile in the gate region. Less standard wells employ a thin epitaxial layer to realize superior mobility or threshold fluctuation characteristics, as noted in the prior art above. All these structures are complementary to the drain extension structure described herein. Region 220 is the gate oxide, which may be standard $SiO_2$, nitrided $SiO_2$ or any of a number of high-K dielectrics. Region 230 is the gate per se, typically formed from polycrystalline or amorphous silicon, doped to achieve relatively high conductivity. When an appropriate voltage is applied to the gate 230, a channel is induced immediately below the gate oxide 220. Region 225 is a non-critical residue of the initial protective oxide. Regions 250 are highly conductive source and drain extensions. These extensions are positioned in shallow recesses located between the channel region and the heavy source/drain implants 270, typically overlapping a portion of the source/drain implant. It is the role of the source and drain extensions 250 to effect a low resistance connection between the heavy implants 270 and the gate-controlled channel induced beneath the gate oxide 220. Various embodiments of this invention may utilize epitaxial silicon within the recesses, or epitaxial germanium, which may provide higher conductivity. An embodiment employs silicon grown epitaxially and incorporating high densities of doping elements during the growth process to form source and drain extensions 250. The extensions 250 could even be formed from metals or metallic compounds as long as their work functions are selected to avoid the existence of Schottky barriers between the drain extensions and their associated conductive channels.

Spacers 260 are typically formed of silicon nitride. In an embodiment, these spacers are mainly important for defining the extent of the conduction enhancing silicide 280. The position of the heavy source/drain implants 270 relative to the gate structure 230 was established by spacers that were sacrificed as part of the overall process sequence. That will become clear in the processing sequence described below, but those spacers do not appear in the completed transistor structure 200. Their position may or may not coincide with the edges of the spacers 260.

The structure of FIG. 2 is also valid for a transistor in which the gate dielectric 220 is a high-K dielectric or the gate 230 includes a layer of metal or a metallic compound adjacent to a high-K layer 220.

The transistor structure 200 in FIG. 2 is incorporated in an integrated circuit by covering it with an interlayer dielectric (ILD), etching contact holes to provide access to the conduction-enhancing silicides 280 associated with the source, gate and drain of the transistor. These steps, which usually use various dielectric depositions, photolithographic definition of contact holes, CVD (chemical vapor deposition) tungsten deposition and chemical mechanical polishing, are well known in the industry, and they lie outside the scope of this invention.

Figure 3A:
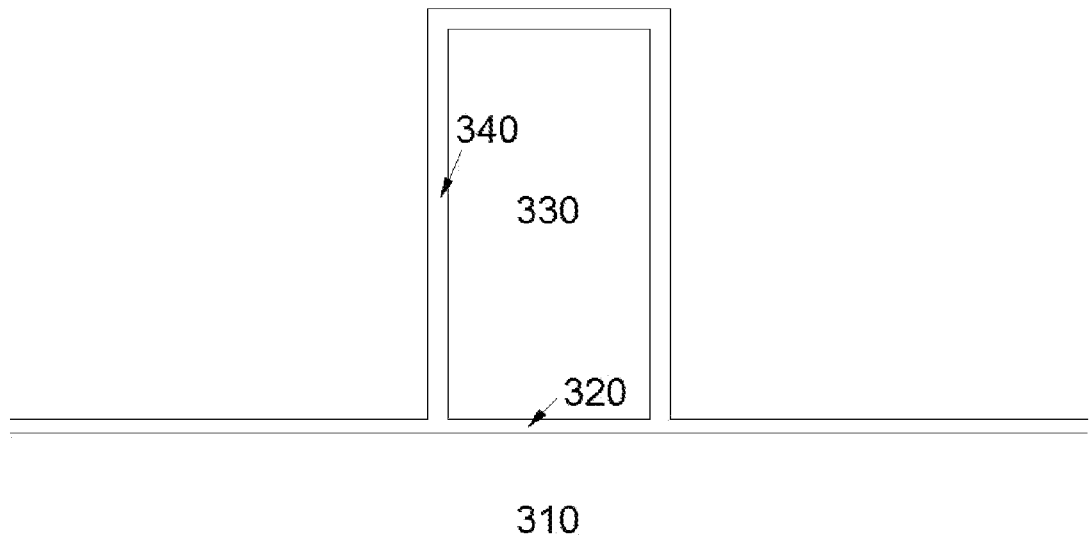
FIG. 3A is a schematic cross section of a gate defining step in realizing a transistor in accordance with an embodiment.

FIGS. 3A through 3K show schematic cross sections of an embodiment as the transistor evolves through a sequence of processing steps. FIG. 3A shows a well 310, which may be a conventional well, a steeply retrograde well or well incorporating an epitaxial layer adjacent the gate oxide. Positioned over that well is a gate oxide 320, which may be pure $SiO_2$, nitrided $SiO_2$, or a high-K dielectric. The gate 330 is located above the gate dielectric 320. The gate has been formed by a sequence of steps that include the deposition of amorphous or polycrystalline silicon, defining a pattern by photolithography, and etching the deposited material to form a pattern of polysilicon interconnect and gates having widths ranging from 14 nm upward to 65 nm and beyond. Subsequent to its patterning, the gate region 330 is oxidized to form a protective film 340 on its sides. In prior art processes, drain extension implants would be performed at this stage in the process flow. No drain extension implants are performed at this stage in this process, although pocket implants may be executed at this stage, depending upon the transistor design.

Figure 3B:
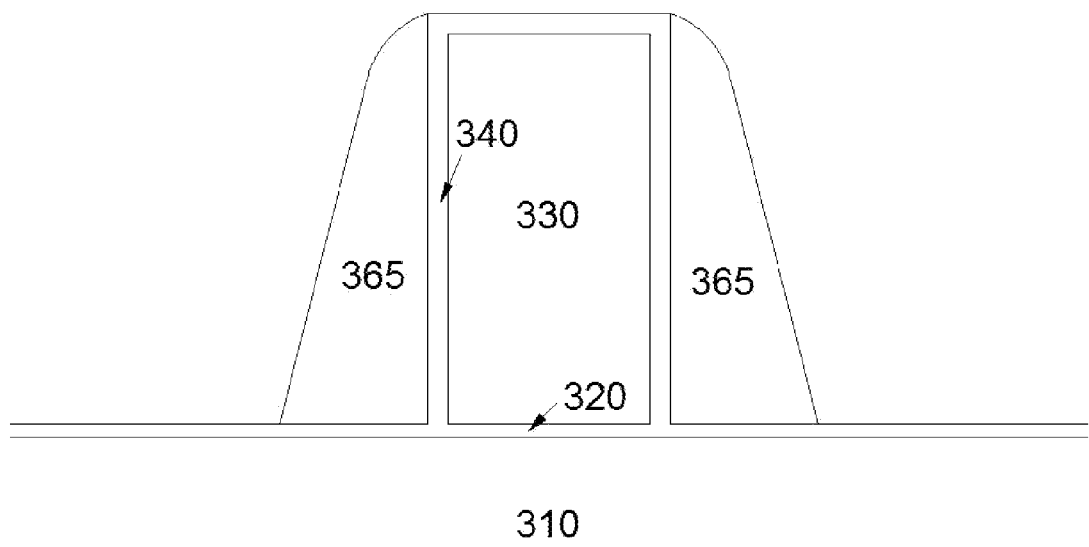
FIG. 3B is a schematic cross section of a first spacer defining step in realizing a transistor in accordance with an embodiment.

FIG. 3B illustrates a first spacer. This sacrificial spacer 365 is the consequence of a sequence of processing steps that include depositing silicon nitride by CVD or plasma enhanced chemical vapor deposition (PECVD) to a controlled thickness, then using an anisotropic plasma etching process to clear the silicon nitride from the surfaces paralleling the plane of the wafer, but leaving a sacrificial spacer 365 on the vertical surfaces. The width of the spacer 365 is largely determined by the thickness of the original deposition. While other materials may be used for the spacer, silicon nitride is a natural choice because it can be etched selectively with respect to $SiO_2$.

Figure 3C:
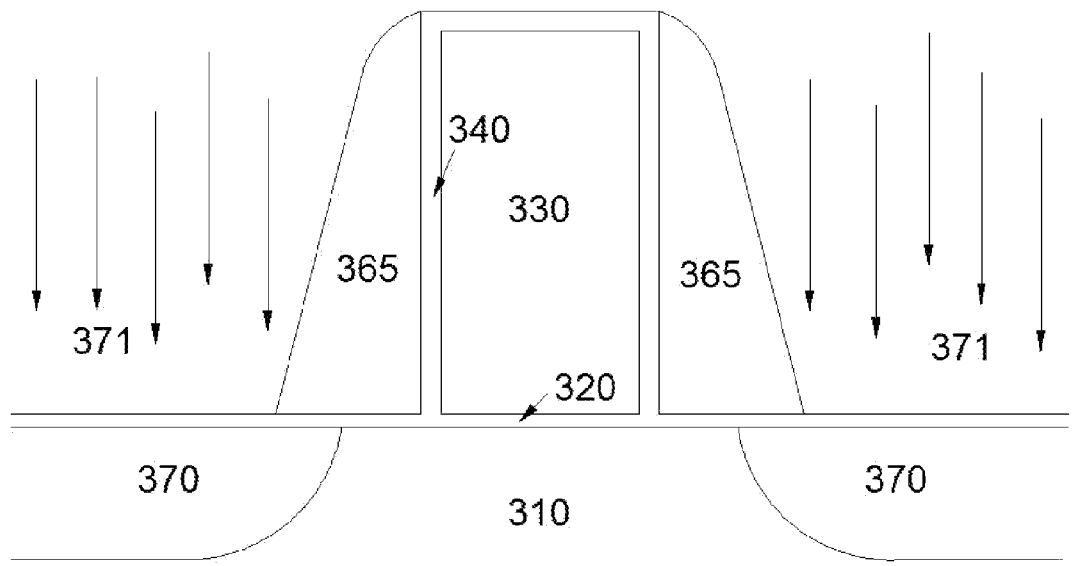
FIG. 3C is a schematic cross section of a heavily doped source and drain defining step in realizing a transistor in accordance with an embodiment.

FIG. 3C shows the formation of the highly doped source and drain regions 370 by ion implantation 371, using the sacrificial spacers 365 as a hard mask that defines the N+ or P+370 position relative to the gate 330. This implant is normally phosphorus and/or arsenic for NMOS transistors and one or more of boron, $BF_2^+$ and indium for PMOS transistors. This implant also enhances the conductivity of the gate 330 and sets its work function advantageously for creating enhancement mode transistors if the gate is silicon-based, not metallic.

Figure 3D:
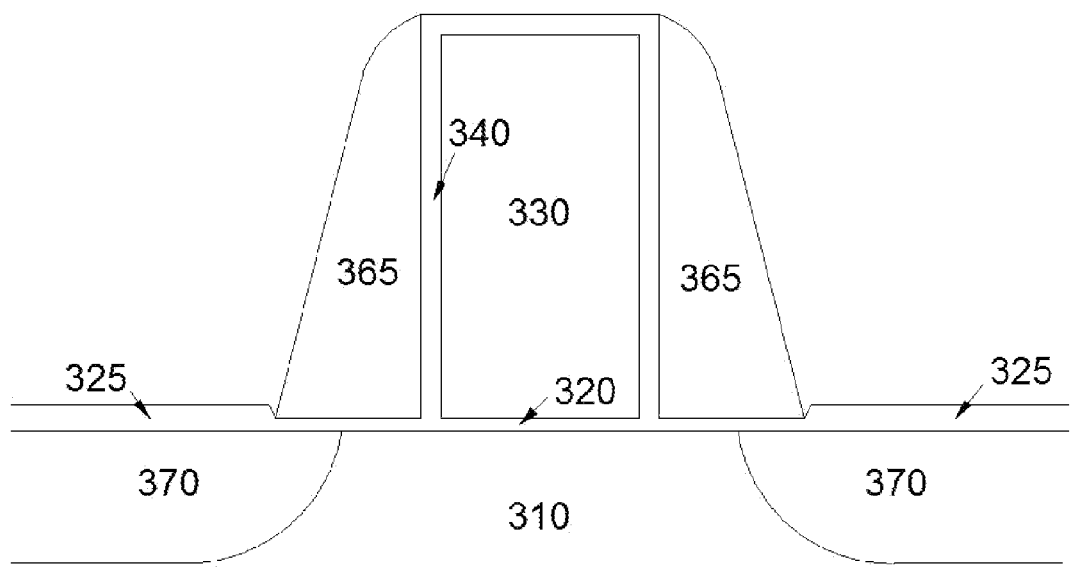
FIG. 3D is a schematic cross section of a source/drain annealing step in realizing a transistor in accordance with an embodiment.

FIG. 3D shows the consequence of annealing the implants 370 in an oxidizing environment. An oxidizing environment is recommended so that the protective oxide 325 is thickened over the regions not shielded from oxidation by the sacrificial spacers 365.

Figure 3E:
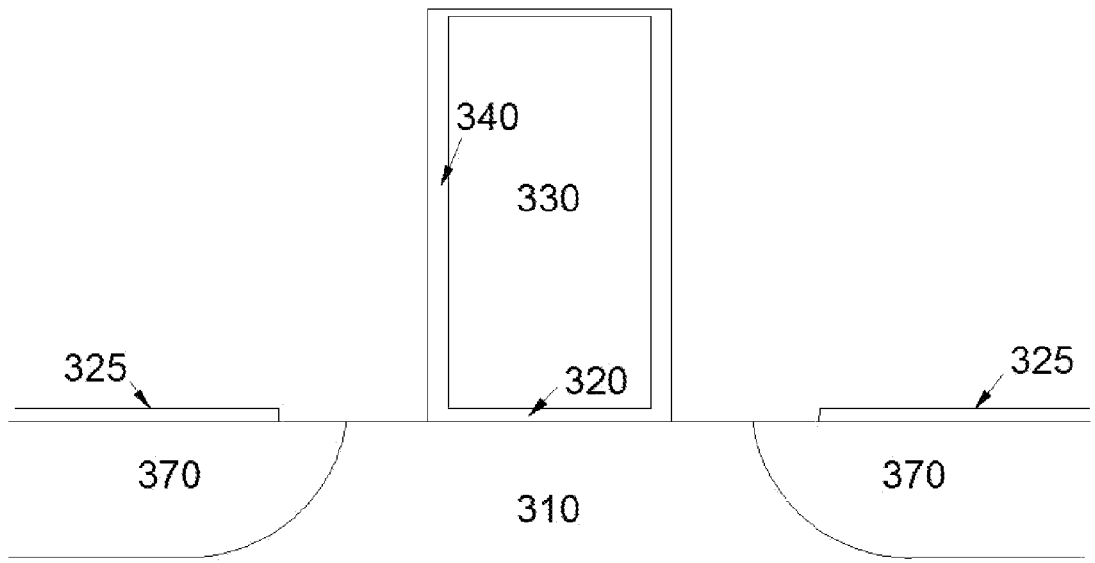
FIG. 3E is a schematic cross section of a first spacer sacrificing step in realizing a transistor in accordance with an embodiment.

FIG. 3E illustrates the state after the spacers 365 have been removed by using an etch that selectively attacks the spacer material without significantly attacking the underlying oxide 325. In the typical case, the spacer material is silicon nitride and hot phosphoric acid is a typical etchant. After the spacers are removed, a controlled, possibly anisotripic, oxide etch is used to clear the thinner oxide that was shielded by the spacers, leaving a protective layer 325 covering most of the source/drain regions 370 but leaving a small portion thereof exposed. The gate sidewall oxide 340 should be retained in this step.

Figure 3F:
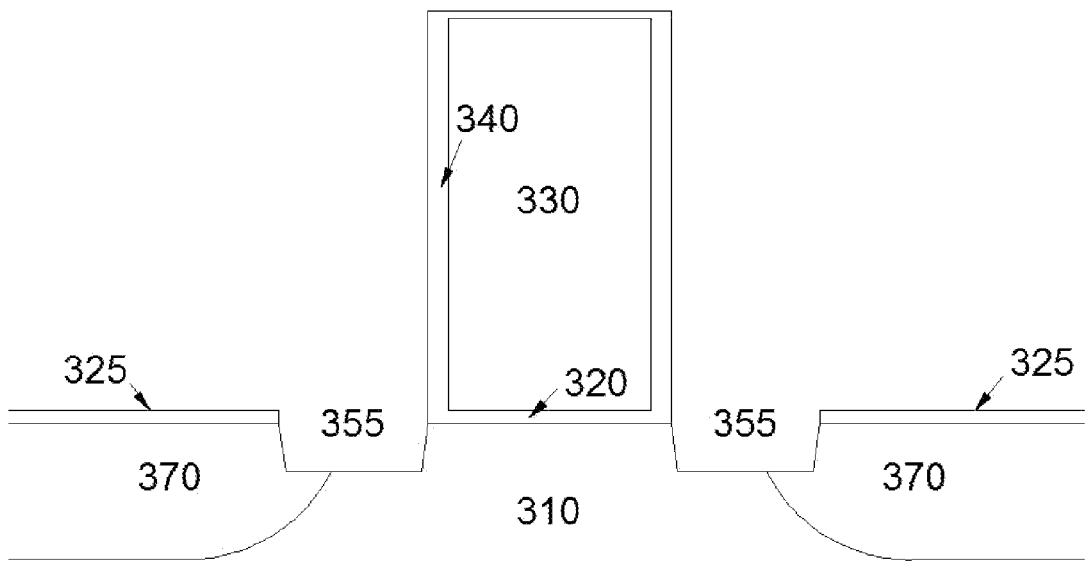
FIG. 3F is a schematic cross section of a source drain extension recess defining step in realizing a transistor in accordance with an embodiment.

FIG. 3F shows the result of using a silicon etch to create a recess 355 in the space between the gate oxide 320 and the implanted sources and drains 370. This recess is typically 10 nm deep, although it could be anywhere in the range of 5 nm to 20 nm deep. The silicon etch has to be selective with respect to $SiO_2$, but it could be either a reactive ion etch or a wet etch employing a strong base like tetramethylammonium hydroxide or potassium hydroxide.

Figure 3G:
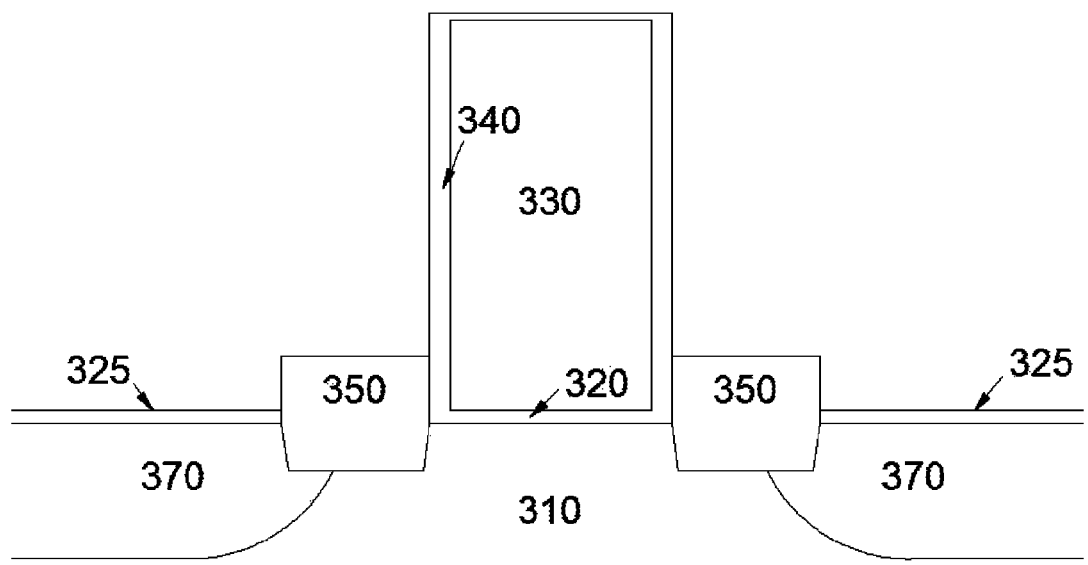
FIG. 3G is a schematic cross section of a source drain extension defining step in realizing a transistor in accordance with an embodiment.

FIG. 3G shows a fabrication of source and drain extensions 350 in the recesses (355 in FIG. 3F). These extensions provide an efficient contact between the source/drain implants 370 and the MOSFET channel, which will be induced immediately beneath the gate oxide 320 when an appropriate voltage is applied to the gate 330. In an embodiment, extensions 350 are manufactured by growing germanium by selective epitaxy in the recesses. Other materials may be appropriately used, including epitaxial silicon, epitaxial Si:Ge, epitaxial Si:C, metals, metallic compounds and metal silicides. If the drain extension material is not a semiconductor like Si, Ge or their alloys, then special attention is required to select a material so it has no significant barrier with respect to the channel or to the source/drain implants 370. If the drain extensions 350 are semiconductor materials, doping those materials in situ is a possibility. This requires two separate epitaxial steps, and an example of that class of flow is shown in the alternate embodiment presented in FIG. 5. Since the intention is to minimize random variations in channel length associated with the diffusion or migration of impurities, it is important that this step and all subsequent steps be performed at low temperatures. Temperatures in excess of 900° C. are to be avoided, and lower temperatures not in excess of 800° C. or 650° C. are preferred.

Figure 3H:
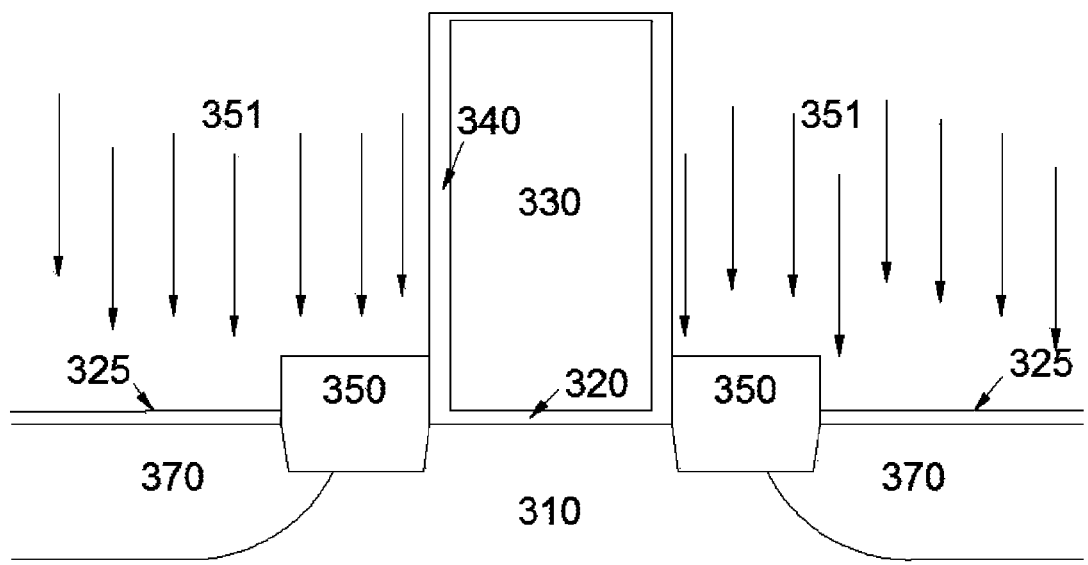
FIG. 3H is a schematic cross section of a source drain extension doping step in realizing a transistor in accordance with an embodiment.

FIG. 3H shows the use of ion implantation 351 to realize a high conductivity in the germanium source and drain extensions 350. For complementary metal oxide semiconductor processes (CMOS) processes, separate implantations are required for the NMOS and PMOS transistors. For NMOS transistors, phosphorus and arsenic are the most appropriate dopants, and for PMOS transistors, boron $BF_2^+$ and indium are appropriate. Gallium is also a less commonly used dopant, but it is also appropriate for PMOS source/drain extensions. After implantation, an activation anneal may be required. That anneal may be as cool as 600° C. It should be noted that the processing associated with creating a highly conductive silicide, as illustrated in FIG. 3J, may involve heat cycles sufficient to activate an implant described in this step. If the source and drain extensions 350 are metallic, implantation 351 and annealing are not required. Alternatively, if the source and drain extensions 350 have been prepared by in-situ doping during an epitaxial deposition process, no annealing is required.

Figure 3I:
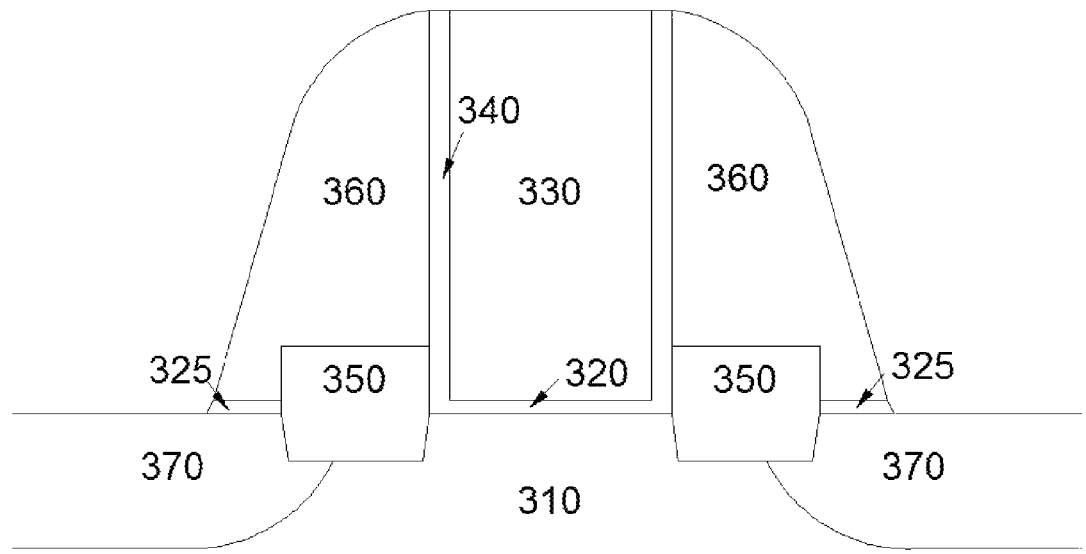
FIG. 3I is a schematic cross section of a second spacer defining step in realizing a transistor in accordance with an embodiment.
Figure 3J:
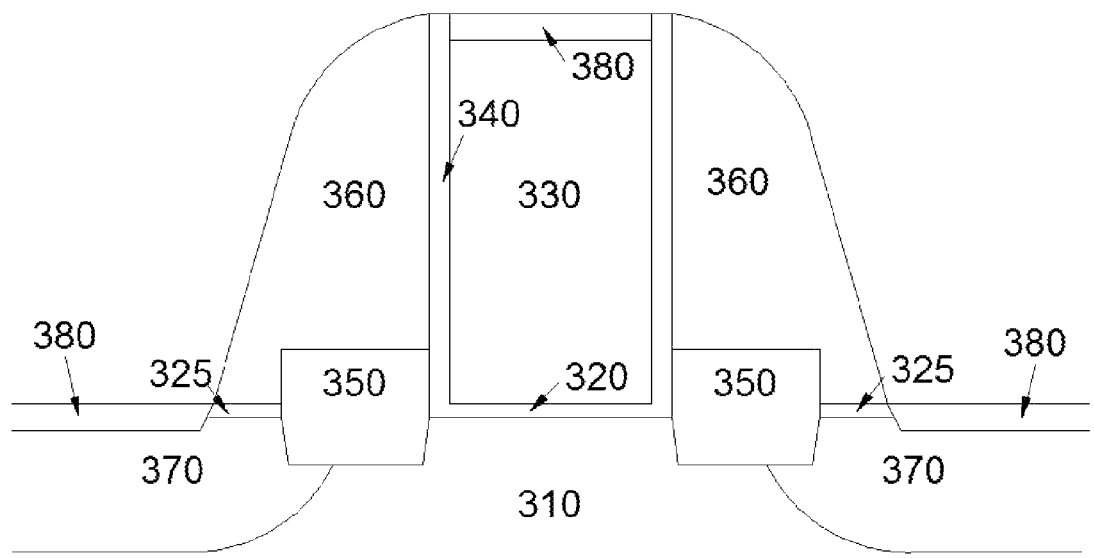
FIG. 3J is a schematic cross section of a source drain conduction enhancing step in realizing a transistor in accordance with an embodiment.
Figure 3K:
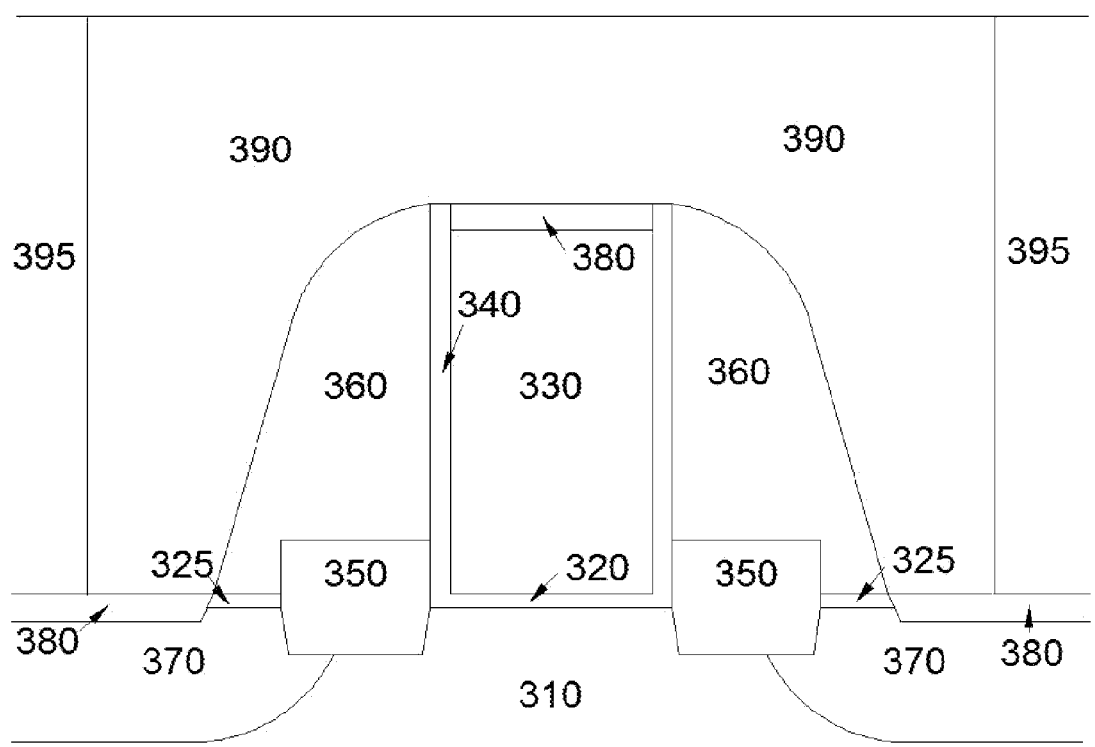
FIG. 3K is a schematic cross section of illustrating the addition of interlayer dielectric and contacts to the transistor of FIG. 3J.

After the extensions 350 have been completed, a new spacer 360 is formed as shown in FIG. 3I. As before, the spacer is typically formed by depositing CVD or PECVD silicon nitride to a thickness approximating the target width of the spacer. Then anisotropic reactive ion etching is used to clear the silicon nitride from the surfaces parallel to the plane of the substrate while leaving the nitride on the sidewalls. The principal role of the spacer 360 is to confine a subsequently formed silicide layer to the surfaces to be contacted. If the nitride layer is deposited by CVD without plasma enhancement, the temperature will be high enough to activate the implant in step 3H. Plasma enhanced CVD may be preferable in order to avoid the higher temperature; it is important to strictly limit the diffusion of dopants from the extensions 350 into the substrate 310 regions immediately beneath the gate 320. The limited diffusion that will naturally occur will improve the junction quality. After the spacer is formed, the unprotected portions of the surface oxide 325 should be removed.

FIG. 3J shows the completion of a transistor sources and drains by forming a layer 380 of titanium silicide, cobalt silicide or nickel silicide. This layer 380 serves both to enhance the sheet conductivity of the source and drain regions 370 and to provide a superior contact capability to the interconnect structures. Silicide formation normally incorporates two rapid thermal annealing steps, and these steps may also be sufficient to activate the implants 351 illustrated in FIG. 3H, making a separate anneal unnecessary. FIGS. 3I and 3J show the spacer 360 broader in extent than the source drain extensions 350, leaving small residues 325 of protective oxide. This means that the final spacer 360 is broader in extent than first, sacrificial spacer (365 in FIG. 3B). This is not strictly necessary, since germanium reacts with titanium, cobalt and nickel to form conductive metal-germanides, just as those metals form conductive silicides.

It may be noted that selective epitaxial growth of Si, Si:Ge, Si:C or Ge can be controlled so there is no growth on the titanium silicide, cobalt silicide or nickel silicide surfaces 380. That presents an opportunity to have a process flow in which the heavily doped sources and drains may be silicided prior to sacrificing the spacer 365. The source and drain extension recesses 355 can then be formed after sacrificing the spacer 365, provided a silicon etch is chosen for its inability to etch the metal silicide surfaces 380. This sequence offers the advantage of forming the source and drain extensions 350 after the high temperature silicidation process.

FIG. 3J shows a completed transistor, but it must be integrated with other transistors and interconnections to form a useful integrated circuit. These steps, well known in the art, are suggested by FIG. 3K. The next step, as in all contemporary integrated circuits, is to deposit one or more layers of ILD (interlayer dielectric) 390 and planarize the surface. Note that, at this stage, it is possible to form a gate-last, high-K/metal gate structure by selectively etching the polycrystalline or amorphous gate material 330 and the underlying gate oxide 320, then replacing those materials with a high-K gate dielectric in the position 320 and a metal gate in position 330. The ILD structure in the gate-last case is completed by chemical-mechanical polishing and a further dielectric deposition. Such implementation of a gate-last process is within the scope of the disclosure herein.

Transistors formed in accordance with these principles with or without gate last structures are further integrated into complex integrated circuits by etching contact holes 395 in the planarized ILD 390 to reach the regions 380 on the sources, gates and drains, and forming contacts that include CVD tungsten filling the holes 395. Interconnection with multiple layers of dielectric and metal completes the integrated circuits. When the transistors described herein are integrated with transistors employing more conventional fabrication, the overall process sequence must be planned to limit the thermal exposure after the source and drain extensions 350 have been implanted or deposited. In general, this means that the steps of etching recesses 355 and depositing the extensions 350 must be done after the high temperature steps in other transistors have been completed.

Figure 4:
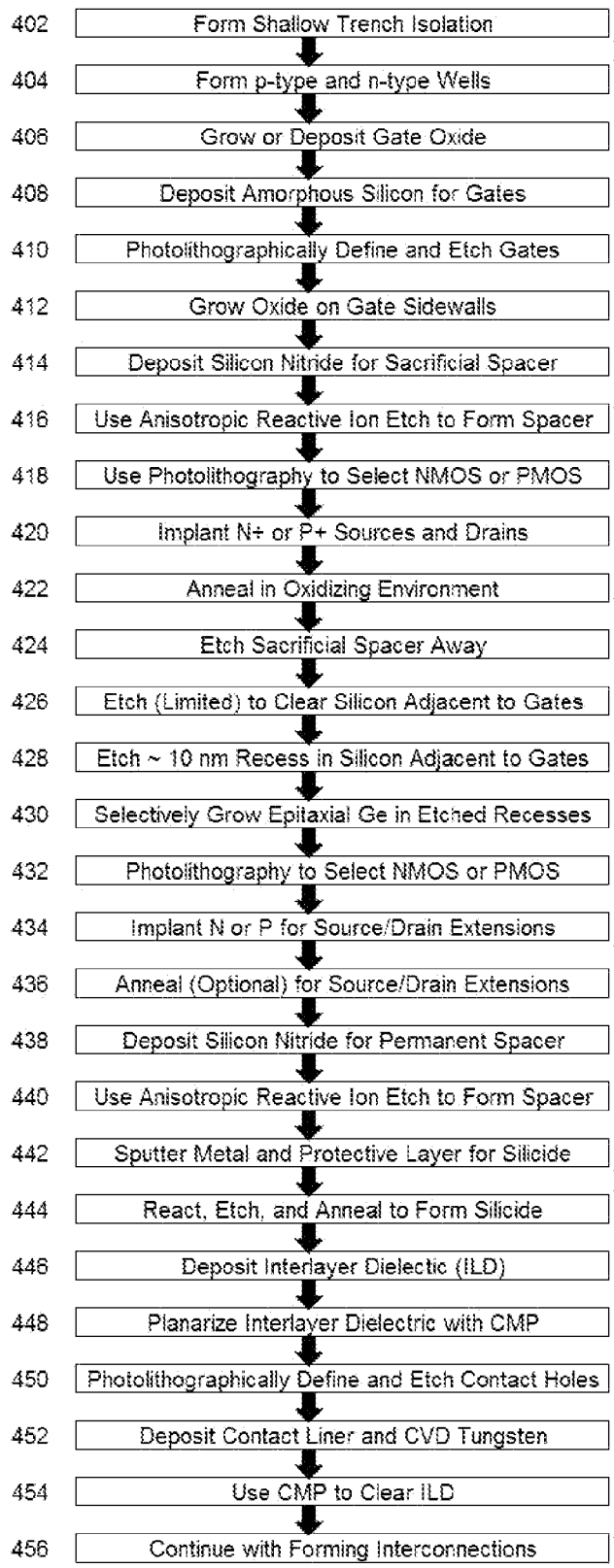
FIG. 4 is a simplified flowchart showing the principal steps required to realize an embodiment.

FIG. 4 is a simplified Flow Chart 400 showing one example of the principal steps required to realize the transistor shown in FIGS. 2 and 3. In this discussion, the particular elements in FIGS. 3A through 3J will be cited for clarification. Steps which are well known in the industry, particular to specific manufacturers and complementary to the replacement drain extensions described here are described very briefly. Steps 402, 404, 406, 408, 410, 412, 414 and 416 are found in most prior art processes. This includes the formation of a spacer 265 in steps 414 and 416, except in this process flow, that spacer is eventually sacrificed. Steps 418 and 420 arrange for heavy implantation 371 of donors to be directed into the sources and drains 370 of NMOS transistors, and for heavy implantation 371 of acceptors to be directed into the sources and drains 370 of PMOS transistors.

Step 422 cites the use of an oxidizing environment during the source and drain anneal in order to thicken the protective oxide 325 except where it is covered by spacers. Step 424 describes removing the sacrificial spacers 365, using an etch that selectively removes silicon nitride without attacking the protective oxide 325. Step 426 is an oxide etch that clears the protective oxide 325 where it is thin, having been shielded by the sacrificial spacer 365. This etch is controlled so that the protective oxide 325 continues to cover the underlying silicon where it was not shielded by the sacrificial spacer 365. In the areas where the silicon is exposed, i.e., adjacent to the gates, step 428 describes etching a recess 355 in the silicon, nominally 10 nm deep, but generally in the range of 5 nm to 20 nm deep. In the next step 430, undoped epitaxial germanium is grown in the recesses 355 in order to form the source and drain extensions 350. The thickness of the epitaxial layer 350 has to be sufficient to fill the recesses 355, and it should be approximately 10 nm thicker. In order to provide high conductivity, the source and drain extensions 350 must be doped with donors for NMOS transistors and acceptors for PMOS transistors. The masking steps 432 must be used to direct the correct implants 351 (see FIG. 3H) to the correct transistors. The implants 351 are indicated by step 434. Step 436 provides for activation of the implants from step 434.

Step 438 describes the commencement of forming a final spacer 360. The sequence of nitride deposition in step 438 and anisotropic etching in step 440 is common in the industry. Subsequent to forming the permanent spacer 360, any remaining protective oxide 325 must be cleared, and the silicide-forming metal is sputtered to a controlled thickness in step 442. Well known processes employ a combination of a reacting metal and a covering film that protects the metal from atmospheric reaction prior to its heat treatment, step 444. The use of a silicide 380 to enhance the conductivity of source and drain diffusions 370 is standard practice in the industry. Further, the heat treatments associated with silicide formation may be adequate to activate the implants 351 cited in step 434. That is why step 436 is described as optional. It should be noted that some process flows use an epitaxial layer either in lieu of or in addition to the silicide layer 380. Either choice is complementary to this embodiment.

Steps 446, 448, 450, 452, 454 and 456 are standard steps in contemporary integrated circuit processing, and they are complementary to this embodiment.

An alternative embodiment of this same structure can be realized by taking advantage of the capability of molecular beam epitaxy (MBE) to create thin, highly doped layers of silicon or silicon/germanium alloy. In this case, the source and drain extensions 250 in FIG. 2 are realized as thin, epitaxial layers of highly doped silicon or silicon/germanium. The flow chart in FIG. 4 showed a single step 430 of epitaxial growth. In this embodiment, two separate epitaxial steps are required, heavily doped n-type for NMOS transistors and heavily doped p-type for PMOS transistors. This distinction is made clear in the exemplary Flow Chart 500 in FIG. 5.

Figure 5:
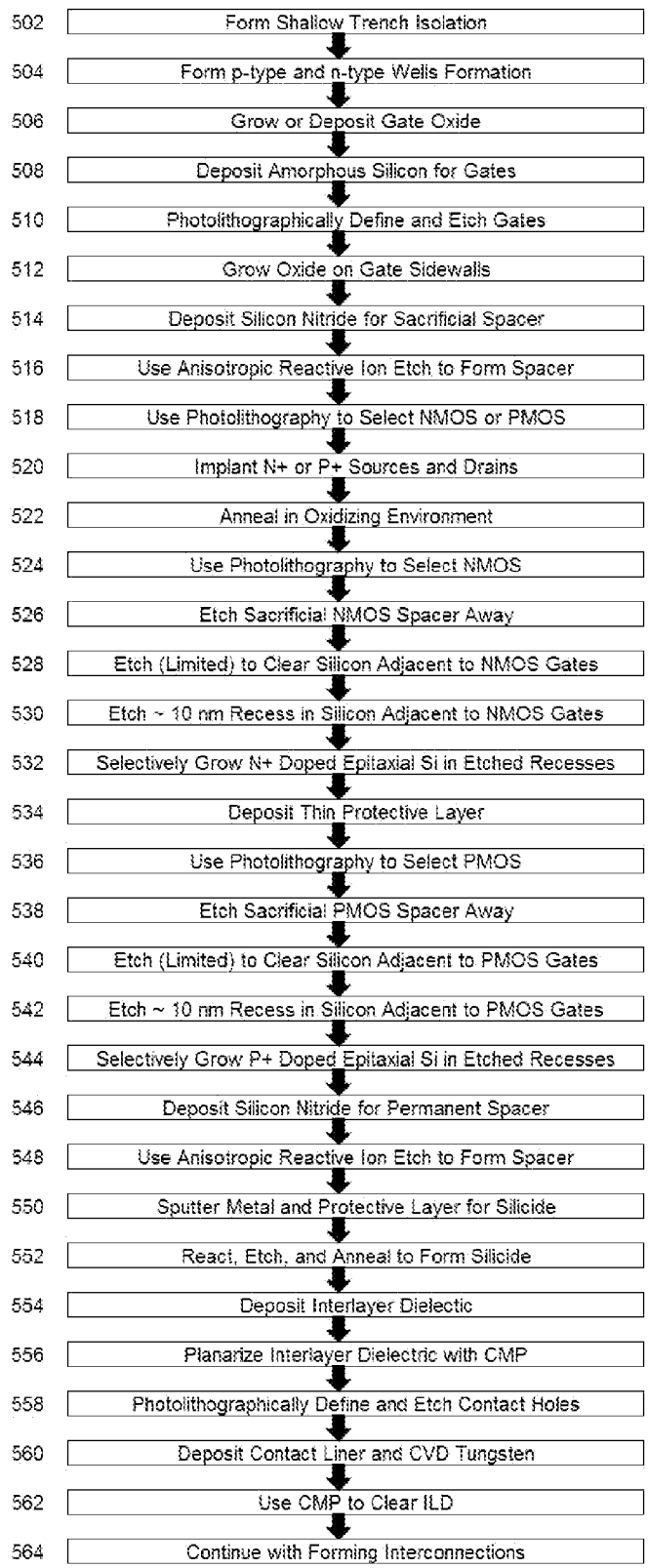
FIG. 5 is a simplified flowchart showing the principal steps required to realize an alternative embodiment.

Steps 502 through 522 in FIG. 5 duplicate steps 402 through 422 in FIG. 4. Since separate epitaxial depositions 350 are required, step 524 uses photolithography to expose the NMOS transistor areas while covering the PMOS transistor areas. Step 526 indicates that the sacrificial spacer 365 is selectively removed from the NMOS transistors, and step 528 bares the silicon that had been beneath the sacrificial gate 365. Step 530 is an etch that creates a recess 355 in the bare silicon adjacent to the gate 330. This recess has a nominal depth of 10 nm. In step 532 a layer of heavily doped silicon 350 is grown in the recess 355, filling that recess and extending 5 to 20 nm above the recess. An exemplary layer will be grown by MBE, utilizing arsenic as a dopant at a concentration between $1\times10^{19}$ ions/cm$^3$ and $1\times10^{21}$ ions/cm$^3$. In order to facilitate further processing, step 534 is the deposition of a thin protective layer of silicon nitride.

In order the process the PMOS transistors, lithography step 536 exposes the PMOS transistors while protecting the NMOS transistors. Step 538 removes the sacrificial spacers 365 from the PMOS transistors as well as the protective nitride from step 534. In steps 540 and 542, the protective oxide 325 adjacent to the PMOS gate 330 is removed, and bare silicon is etched to create a recess nominally 10 nm deep. Step 544 forms PMOS source and drain extensions 350 using MBE employing boron as a p-type dopant, and the boron concentration should be in the range of $1\times10^{19}$ ions/cm$^3$ and $1\times10^{21}$ ions/cm$^3$. The thickness of the boron doped epi layer 350 should be sufficient at least to fill the recess 355, and it is preferably 5 nm to 20 nm thicker.

The steps 546 through 564 in Flow Chart 500 are identical to steps 438 through 456 in Flow Chart 400.

Transistors formed in accordance with these principles with or without gate last structures are further integrated into complex integrated circuits by etching contact holes in the planarized ILD to reach the regions 380 on the sources, gates and drains, and forming contacts that include CVD tungsten. Interconnect with multiple layers of dielectric and metal completes the integrated circuits. When these transistors are integrated with transistors employing more conventional fabrication, the overall process sequence must be planned to limit the thermal exposure after the source and drain extensions 350 have been implanted. In general, this means that the steps of etching recesses 355 and depositing the extensions 350 must be done after the high temperature steps in other transistors have been completed.

While the descriptions above have used an example of bulk silicon substrates, the same basic processing steps may be used for silicon-on-insulator transistors. Where the processing incorporates epitaxial growth, that growth will be dominated by the single crystal surfaces available after the recess is etched, but the resulting structure will offer the same advantages in terms of reduced variations in channel length.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

The invention disclosed herein describes a transistor structure having source and drain extensions that are specifically fabricated to minimize the random variations in channel length associated with implanted and diffused source and drain extensions. A person of ordinary skill-in-the-art would readily understand that the invention can be adapted for use in a plurality of ways, including integrated circuits where all transistors or a portion thereof are manufactured using the techniques disclosed hereinabove. Furthermore, although the invention is described herein with reference to the preferred embodiments, one skilled-in-the-art will readily appreciate that other applications may be substituted for those set forth herein without departing from the spirit and scope of the present invention. Accordingly, the invention should only be limited by the Claims included below.

What is claimed is:

1. A metal-oxide semiconductor (MOS) transistor having reduced random threshold variations σVT through reduced channel length variability, the MOS transistor comprising:
   a gate having an oxide on its sides;
   a channel region;
   the gate being insulated from the channel region by a gate dielectric;
   an implanted source region, adjacent but spaced away from a first end, that is a source end, of the channel region;
   an implanted drain region, adjacent but spaced away from a second end, that is the drain end, of the channel region, the second end being opposite to the first end;
   an epitaxial source extension layer in a first recess partially formed within a part of the implanted source region and adjacent the source end of the channel region, the epitaxial source extension layer contacting the implanted source region and the source end of the channel region and extending below, but not extending under, any of the gate dielectric;
   an epitaxial drain extension layer in a second recess partially formed within a part of the implanted drain region and adjacent the drain end of the channel region, the epitaxial drain extension layer contacting the implanted drain region and the drain end of the channel region and extending below, but not extending under, any of the gate dielectric.

2. The MOS transistor of claim 1, wherein doping related randomization of at least an interface between the source extension layer and the drain extension layer and the adjacent ends of the respective channel regions is no greater than a statistical variability of at least an etch defining the first recess and second recess.

3. The MOS transistor of claim 1, wherein diffusion related randomization of at least an interface between the source extension layer and the drain extension layer and the adjacent ends of the respective channel regions is no greater than a statistical variability of at least an etch defining the first recess and second recess.

4. The MOS transistor of claim 1, wherein migration related randomization of at least an interface between the source extension layer and the drain extension layer and the adjacent ends of the respective channel regions is no greater than a statistical variability of at least an etch defining the first recess and second recess.

5. The MOS transistor of claim 1, wherein scattering related randomization of at least an interface between the source extension layer and the drain extension layer and the adjacent ends of the respective channel regions is no greater than a statistical variability of at least an etch defining the first recess and second recess.

6. The MOS transistor of claim 1, wherein material forming the source extension layer and the drain extension layer is any one of: epitaxially grown silicon, epitaxially grown silicon/germanium, epitaxially grown silicon/carbon, or epitaxially grown germanium.

7. The MOS transistor of claim 6, wherein the epitaxially grown material is doped to a high conductivity in the same polarity of the implanted source region or the implanted drain region.

8. The MOS transistor of claim 1, wherein material forming the drain extension layer is any one of a metal or a metallic compound.

9. The MOS transistor of claim 1, wherein the MOS transistor is positioned on: a bulk substrate with any one of a conventional well, retrograde well, or on a doped or undoped epitaxial layer grown on a substrate with any one of a blanket in-situ doped well, a conventional well or a retrograde well.

10. The MOS transistor of claim 1, wherein the MOS transistor is positioned on a silicon-on-insulator substrate.

11. The MOS transistor of claim 1, further comprising a gate over the channel region, separated from the channel by a gate dielectric, the gate being comprised of any one of: a polycrystalline silicon, an amorphous silicon, a metal, or a metallic compound.

12. A metal-oxide semiconductor (MOS) transistor formed in a semiconducting substrate having reduced random threshold variations σVT through reduced channel length variability, the MOS transistor comprising, comprising:
a channel region;
a gate region formed over the channel region, but separated from the channel region by a gate dielectric;
a source extension layer formed in a first recess in the semiconducting substrate, adjacent a first end of the channel region that is a source end of the channel region;
a drain extension layer formed in a second recess, in the semiconducting substrate adjacent a second end of the channel region that is a drain end of the channel region;
the drain end of the channel region being at the opposite end of the channel from the source end of the channel region;
an implanted source region in the semiconducting substrate adjacent an end of the source extension layer spaced away from the source end of the channel region;
an implanted drain region formed in the semiconductor substrate adjacent an end of the drain extension layer spaced away from the drain end of the channel region;
the source extension layer being in contact with the source region and the source end of the channel region and extending below, but not extending under, any of the gate dielectric; and
the drain extension layer being in contact with the drain region and the drain end of the channel region and extending below, but not extending under, any of the gate dielectric.

13. The MOS transistor of claim 12, where in the randomization of at least an interface between the source extension layer and the drain extension layer and the adjacent ends of the respective channel regions due to any of a doping, a diffusion, a migration or a scattering is no greater than a statistical variability of at least an etch defining the first recess and second recess.

14. The MOS transistor of claim 12, wherein material forming the source extension layer and the drain extension layer is any one of: epitaxially grown silicon, epitaxially grown silicon/germanium, epitaxially grown silicon/carbon, or epitaxially grown germanium.

15. The MOS transistor of claim 12, wherein the epitaxially grown source and drain extension layers are doped to a high conductivity with the same polarity dopant as the implanted source region and the implanted drain region.

16. The MOS transistor of claim 12, wherein the MOS transistor is positioned on a bulk substrate with any one of a conventional well, retrograde well, or on a doped or undoped epitaxial layer grown on a substrate with any one of a blanket in-situ doped well, a conventional well, a retrograde well.

17. The MOS transistor of claim 12, wherein the MOS transistor is positioned on a silicon-on-insulator substrate.

18. The MOS transistor of claim 12, further comprising a gate over the channel region, separated from the channel by a gate dielectric, the gate being comprised of any one of: a polycrystalline silicon, an amorphous silicon, a metal, or a metallic compound.

19. The MOS transistor of claim 12, wherein material forming the drain extension layer is any one of: a metal or a metallic compound.

* * * * *